United States Patent [19]
Flannagan et al.

[11] Patent Number: 5,287,314
[45] Date of Patent: Feb. 15, 1994

[54] BICMOS SENSE AMPLIFIER WITH REVERSE BIAS PROTECTION

[75] Inventors: Stephen T. Flannagan; Taisheng Feng, both of Austin, Tex.

[73] Assignee: Motorola, Inc., Schaumburg, Ill.

[21] Appl. No.: 887,968

[22] Filed: May 26, 1992

[51] Int. Cl.$^5$ .............................. G11C 11/34
[52] U.S. Cl. .................... 365/208; 307/530; 365/177; 365/189.06
[58] Field of Search ............ 365/177, 189.06, 190, 365/203, 208, 207; 307/530, 570, 355

[56] References Cited

U.S. PATENT DOCUMENTS

| | | | |
|---|---|---|---|
| 4,604,533 | 8/1986 | Miyamoto et al. | 307/530 |
| 4,658,159 | 5/1987 | Miyamoto | 307/530 |
| 4,961,168 | 10/1990 | Tran | 365/189.1 |
| 4,984,196 | 1/1991 | Tran et al. | 365/51 |
| 4,984,207 | 1/1991 | Tateno et al. | 365/208 |
| 4,991,141 | 2/1991 | Tran | 365/207 |
| 4,999,519 | 3/1991 | Kitsukawa et al. | 307/446 |
| 5,046,050 | 9/1991 | Kertis | 365/208 |

Primary Examiner—Eugene R. LaRoche
Assistant Examiner—Christopher R. Glembocki
Attorney, Agent, or Firm—Daniel D. Hill

[57] ABSTRACT

A memory (50) having a BICMOS sense amplifier (20) includes a differential amplifier stage (11), emitter-follower input transistors (25 and 26), and emitter-follower output transistors (27 and 28). When sense amplifier (20) is deselected, P-channel transistors (31-37) pull the bases of the bipolar transistors (23-28) to $V_{DD}-2V_{BE}$ and P-channel transistors (29 and 30) decouple the bases of emitter-follower output transistors (27 and 28) from the collectors of transistors (23 and 24). At the same time, N-channel transistors (38, 40, 42, 44, and 46) decouple N-channel transistors (39, 41, 43, 45, and 47) from the emitters of bipolar transistors (23-28). Thus, no current can flow, reducing the power consumption of sense amplifier (20). Also, bipolar transistors (23-28) are prevented from being excessively reverse-biased. Additionally, a plurality of sense amplifiers (20) can have their outputs wired-OR connected.

22 Claims, 3 Drawing Sheets

BICMOS SENSE AMPLIFIER WITH REVERSE BIAS PROTECTION

FIELD OF THE INVENTION

This invention relates generally to sense amplifiers, and more particularly, to BICMOS sense amplifiers.

BACKGROUND OF THE INVENTION

An integrated circuit memory, such as a static random access memory (SRAM), is generally implemented as an array of memory cells in a plurality of rows and columns. An array may be subdivided into blocks of memory cells. The memory cells are addressable through block, row, and column decoders for reading data from the memory cells or writing data into the memory cells. During a read cycle, a word line selects the addressed row of memory cells and a pair of complementary bit lines communicate the data between the addressed row and a sense amplifier. The data exists as a relatively small differential voltage on the pair of complementary bit lines. A sense amplifier detects and amplifies the differential voltage and communicates it to the data output stage of the integrated circuit memory via read global data lines.

BICMOS integrated circuit memories are constructed by including bipolar transistors and complementary metal-oxide-semiconductor (CMOS) transistors on the same integrated circuit. Bipolar transistors are often used as output devices in BICMOS circuits to provide high output current and fast switching speed, while CMOS transistors are used in the logic elements because of their low power operation. Sense amplifiers are among the circuits on a BICMOS integrated circuit memory that includes bipolar transistors in order to achieve faster operating speeds.

Generally, a BICMOS sense amplifier circuit includes a differential amplifier to receive signals from a bit line pair. A common-emitter differential amplifier includes a pair of NPN bipolar transistors having their emitters connected together. A constant current source is applied to the coupled emitters, and a relatively small differential input signal from a selected bit line pair is received at the bases of the pair of bipolar transistors. In response, an output signal is provided at the collector of each of the bipolar transistors. A load may be connected between the collectors of the differential pair and the positive power supply voltage. An emitter-follower input or output stage may also be included to drop the input or output signal level depending on the particular application.

Several problems must be overcome when including bipolar transistors in a sense amplifier. In order to receive the benefit of fast operating speeds, each bipolar transistor in the circuit typically should be operated in its nonsaturation region. If a bipolar transistor falls into saturation, it may take a long time for the bipolar transistor to recover from the saturated state, thus decreasing the operating speed of the integrated circuit memory. Also, if a bipolar transistor is subjected to a large reverse-bias across its base-emitter junction, degradation of the transistor occurs. Over time, the constant application of this large reverse bias may cause the bipolar transistor to fail, resulting in a failure of the entire integrated circuit. However, a small reverse bias is acceptable, and may even be desirable in some applications.

In order to reduce the area on the integrated circuit memory occupied by the sense amplifiers, sense amplifiers are sometimes shared by adjacent blocks of memory cells, thus reducing the number of sense amplifiers in the integrated circuit memory. Additionally, it is often desirable in an integrated circuit memory for the outputs of a plurality of sense amplifiers to be wired-OR connected to the read global data line pairs to obtain the logic OR function. In order to be wired-OR connected, the outputs should be electronically deselectable from the read global data line pairs. To reduce power consumption of the sense amplifier when it is deselected, it is advantageous to switch off the sense amplifier as well. However, the resolution of one problem often creates other problems that must also be addressed, further complicating the sense amplifier.

It is a common practice to use a MOSFET transistor as an active load on the collector of each bipolar transistor in the differential amplifier. To reduce power consumption when the sense amplifier is deselected, the load transistors and the current source are switched off so that they are nonconductive, thus preventing any current flow through the sense amplifier. When the load transistors are switched off, the voltage drop across them may cause the bipolar transistors to drop in the saturation region, thus increasing the time it takes to switch the bipolar transistors on again. P-channel transistors are sensitive to the power supply voltage, temperature, process variations, and to the current source. This may cause the drain-source voltage of the P-channel transistor to vary, thus decreasing the noise margin, or causing the bipolar transistors to operate in the saturation region.

If the collector of each bipolar transistor is coupled to the positive power supply voltage terminal, the transistor is prevented from falling into saturation, but then an emitter-follower output transistor of the sense amplifier, when deselected, may be prevented from being wired-OR connected to the read global data line pair with other sense amplifiers. This is because noise, or a voltage spike or glitch from the power supply and through one of the differential transistors may cause the emitter-follower output transistors to become conductive. If one of the emitter-follower output transistors inadvertently becomes conductive when it is wired-OR connected to the read global data line pair, the data on the global data line pair becomes unreliable.

If the current source of the differential amplifier is switched off to prevent current flow when the sense amplifier is deselected, the common emitters may become "floating". If the emitters are floating, there is a potential reverse-bias problem of the differential pair of transistors. One solution to the problem of floating emitters is to use two current sources. One current source for normal operation, and another, smaller current source to prevent the emitters from floating when the sense amplifier is deselected. The problem with using a second current source, although smaller, is that the sense amplifier is still consuming power even though it is deselected. Schottky transistors and diodes have been used to prevent bipolar transistors from operating in the saturation region, but the process steps for fabricating a Schottky transistor are not easily adaptable to the BICMOS fabrication process.

SUMMARY OF THE INVENTION

Accordingly, there is provided, in one form, a memory having a write mode, for writing data into a selected memory cell via a selected bit line pair, and a read mode, for readinh data provided onto a selected bit line pair. The memory comprises a plurality of memory cells, a row decoder, a column decoder, and a sense amplifier. The plurality of memory cells are coupled to word lines and bit line pairs. Each memory cell receives data from the bit line pair to which it is coupled, when the word line to which the memory cell is coupled is selected. The row decoder is coupled to the word lines, and enables a selected word line as determined by a row address. The column decoder is for coupling a selected bit line pair to a data line pair as determined by a column address. The sense amplifier is for sensing and amplifying data on the data line pair when the memory is in a read mode. The sense amplifier comprises an amplifier, a first transistor, a coupling portion, and a biasing portion. The amplifier has an input terminal for receiving an input signal, and an output terminal. The first transistor has a collector coupled to a first power supply voltage terminal, an emitter for providing an output signal, and a base. The coupling portion is for coupling the output terminal of the amplifier to the base of the first transistor in response to a control signal being in a first logic state. The biasing portion is for biasing the base of the first transistor to a predetermined voltage in response to the control signal being in a second logic state.

These and other features and advantages will be more clearly understood from the following detailed description taken in conjunction with the accompanying drawings.

DESCRIPTION OF THE PREFERRED EMBODIMENT

Figure 1:
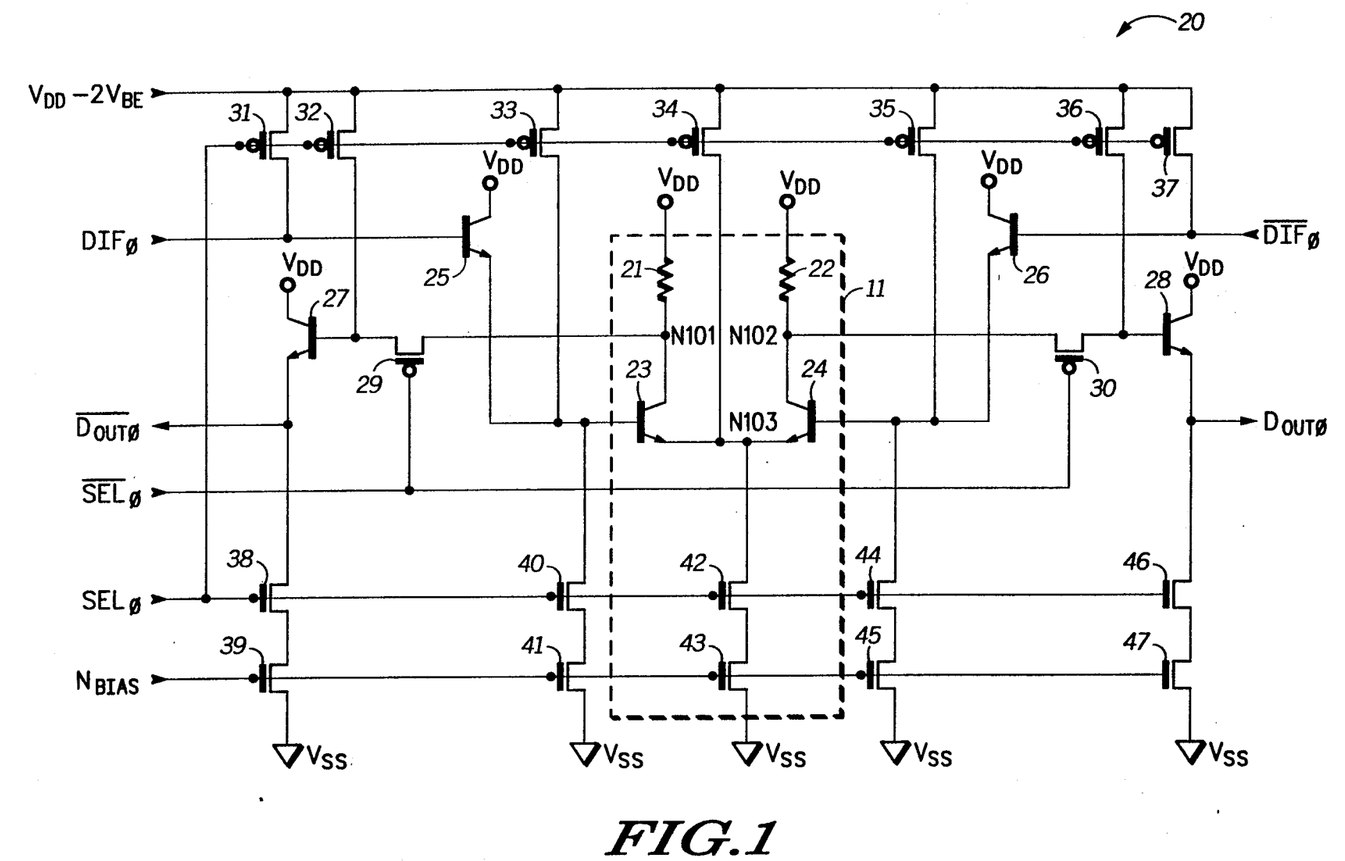
FIG. 1 illustrates in schematic form a sense amplifier in accordance with the present invention.

FIG. 1 illustrates in schematic form, sense amplifier 20 in accordance with the present invention. Sense amplifier 20 includes resistors 21 and 22, NPN transistors 23–28, P-channel transistors 29 and 30, P-channel transistors 31–37, and N-channel transistors 38–47. Differential amplifier 11 includes resistors 21 and 22, NPN transistors 23 and 24, and N-channel transistors 42 and 43. Resistor 21 has a first terminal connected to a positive power supply voltage terminal labeled "$V_{DD}$" and a second terminal. Resistor 22 has a first terminal connected to $V_{DD}$ and a second terminal. NPN transistor 23 has a collector connected to the second terminal of resistor 21 at a node labeled "N101", a base, and an emitter. NPN transistor 24 has a collector connected to the second terminal of resistor 22 at a node labeled "N102", a base, and an emitter connected to the emitter of transistor 23 at a node labeled "N103". NPN transistor 25 has a collector connected to $V_{DD}$, a base for receiving an input signal labeled "$DIF_0$", and an emitter connected to the base of transistor 23. NPN transistor 26 has a collector connected to $V_{DD}$, a base for receiving an input signal labeled "$\overline{DIF_0}$", and an emitter connected to the base of transistor 24. NPN transistor 27 has a collector connected to $V_{DD}$, a base, and an emitter for providing an output signal labeled "$\overline{D_{OUT0}}$". NPN transistor 28 has a collector connected to $V_{DD}$, a base, and an emitter for providing an output signal labeled "$D_{OUT0}$".

P-channel transistor 29 has a first drain/source terminal connected to the base of transistor 27, a gate for receiving a select signal labeled "$\overline{SEL_0}$", and a second drain/source terminal connected to the collector of transistor 23 at node N101. P-channel transistor 30 has a first drain/source terminal connected to the base of transistor 28, a gate for receiving $\overline{SEL_0}$, and a second drain/source terminal connected to the collector of transistor 24 at node N102. P-channel transistor 31 has a source connected to a voltage source labeled "$V_{DD}-2\,V_{BE}$", a gate for receiving a select signal labeled "$SEL_0$", and a drain connected to the base of transistor 25. P-channel transistor 32 has a source connected to $V_{DD}-2\,V_{BE}$, a gate for receiving select signal $SEL_0$, and a drain connected to the base of transistor 27. P-channel transistor 33 has a source connected to $V_{DD}-2\,V_{BE}$, a gate for receiving select signal $SEL_0$, and a drain connected to the base of transistor 23. P-channel transistor 34 has a source connected to $V_{DD}-2\,V_{BE}$, a gate for receiving select signal $SEL_0$, and a drain connected to the emitters of transistors 23 and 24. P-channel transistor 35 has a source connected to $V_{DD}-2\,V_{BE}$, a gate for receiving select signal $SEL_0$, and a drain connected to the base of transistor 24. P-channel transistor 36 has a source connected to $V_{DD}-2\,V_{BE}$, a gate for receiving select signal $SEL_0$, and a drain connected to the base of transistor 28. P-channel transistor 37 has a source connected to $V_{DD}-2\,V_{BE}$, a gate for receiving select signal $SEL_0$, and a drain connected to the base of transistor 26.

N-channel transistor 38 has a drain connected to the emitter of transistor 27, a gate for receiving select signal $SEL_0$, and a source. N-channel transistor 39 has a drain connected to the source of transistor 38, a gate for receiving a bias voltage labeled "$N_{BIAS}$", and a source connected to a negative power supply voltage terminal labeled "$V_{SS}$". N-channel transistor 40 has a drain connected to the emitter of transistor 25, a gate for receiving select signal $SEL_0$, and a source. N-channel transistor 41 has a drain connected to the source of transistor 40, a gate for receiving bias voltage $N_{BIAS}$, and a source connected to $V_{SS}$. N-channel transistor 42 has a drain connected to the emitters of transistors 23 and 24, a gate for receiving select signal $SEL_0$, and a source. N-channel transistor 43 has a drain connected to the source of transistor 42, a gate for receiving bias voltage $N_{BIAS}$, and a source connected to $V_{SS}$. N-channel transistor 44 has a drain connected to the emitter of transistor 26, a gate for receiving select signal $SEL_0$, and a source. N-channel transistor 45 has a drain connected to the source of transistor 44, a gate for receiving bias voltage $N_{BIAS}$, and a source connected to $V_{SS}$. N-channel transistor 46 has a drain connected to the emitter of transistor 28, a gate for receiving select signal $SEL_0$, and a source. N-channel transistor 47 has a drain connected to the source of transistor 46, a gate for receiving bias voltage $N_{BIAS}$, and a source connected to $V_{SS}$.

Sense amplifier 20 can be used with TTL or ECL input/output logic levels. For TTL logic levels, the positive power supply voltage is nominally 5.0 volts and the negative power supply voltage is the system ground. For ECL logic levels, the positive power supply voltage is nominally the system ground and the negative power supply voltage is $-5.2$ volts. Bias voltage $N_{BIAS}$ is a conventional $N_{BIAS}$ voltage generator for biasing an N-channel transistor to provide a constant current source. The type of bias voltage used is not critical to the invention and depends on the type of current source used. In the preferred embodiment, N-channel transistors are used for the current sources. However, P-channel or bipolar transistors could also been used as current sources in other embodiments. Select signals $SEL_0$ and $\overline{SEL_0}$ are differential select signals for selecting and deselecting sense amplifier 20. Input signals $DIF_0$ and $\overline{DIF_0}$ are differential input signals corresponding to the differential signals received from a single selected bit line pair. The voltage difference between $DIF_0$ and $\overline{DIF_0}$ is relatively small, (approximately 100 mV).

Figure 3:
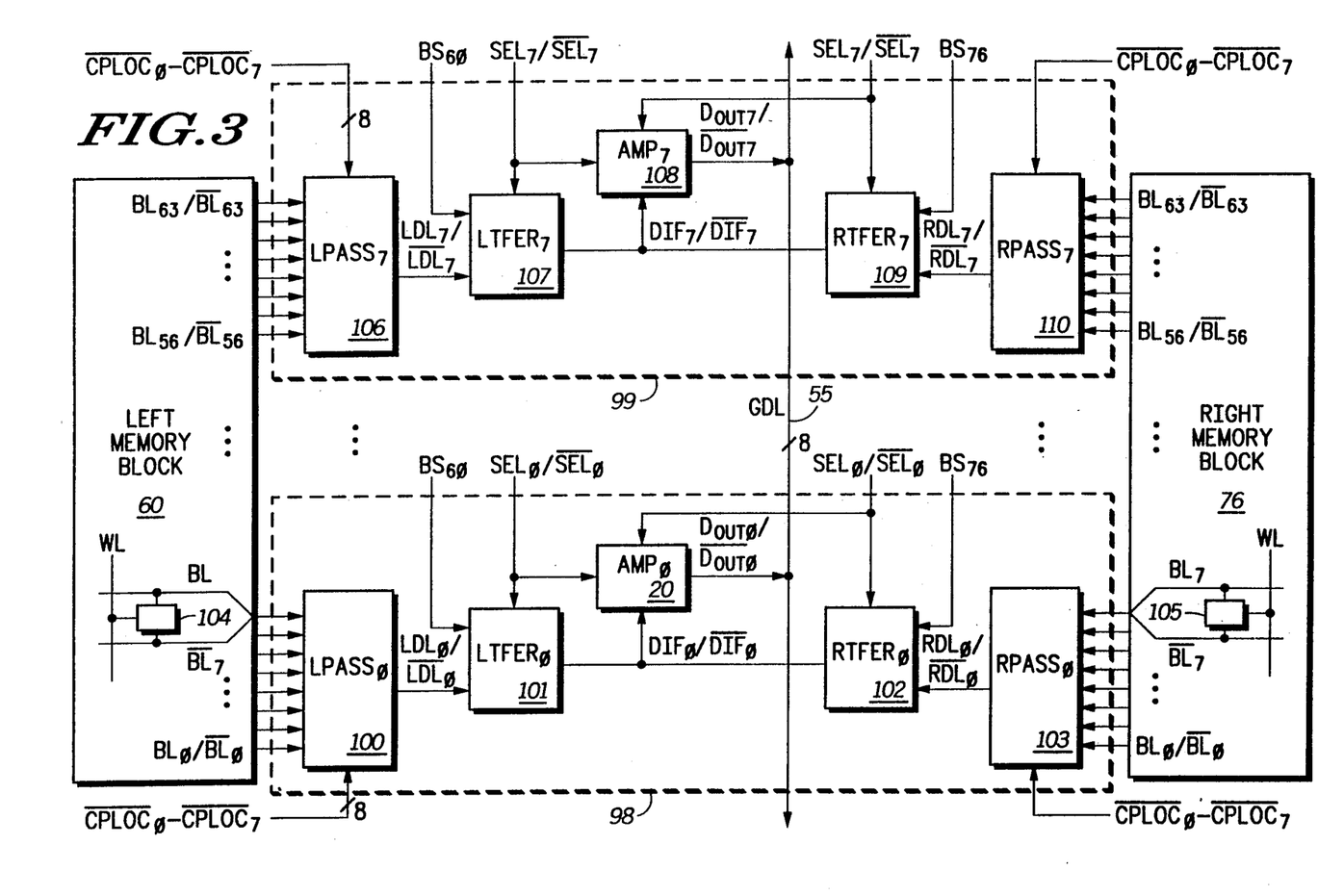
FIG. 3 illustrates in block diagram form a portion of the memory of FIG. 2 incorporating the present invention.

During normal operation, when sense amplifier 20 is selected, select signal $SEL_0$ is a logic high, causing P-channel transistors 31–37 to be off, (or nonconductive). N-channel transistors 38, 40, 42, 44, and 46 are switched on (or conductive). Select signal $\overline{SEL_0}$ is a logic low, causing P-channel transistors 29 and 30 to be conductive, thus, coupling transistor 27 to node N101 and transistor 28 to node N102. When selected, amplifier 20 operates in a conventional manner for a differential amplifier with emitter-follower inputs and outputs. Output signals $D_{OUT0}$ and $\overline{D_{OUT0}}$ are provided to a pair of read global data line pairs 55, which are illustrated in FIG. 3, and will be discussed later. If input signal $DIF_0$ is a higher voltage than input signal $\overline{DIF_0}$, transistor 23 is conductive and transistor 24 is nonconductive, so that a current designated as $I_{43}$ is steered through transistor 23. The voltage at node N101 is equal to $I_{43}R_{21}$, where $R_{21}$ is the resistance of resistor 21. The voltage at node N102 is equal to $V_{DD}$ since substantially no current is flowing through transistor 24. $D_{OUT0}$ is therefore equal to $V_{DD}-V_{BE}$, where $V_{BE}$ is equal to one base-emitter diode voltage drop (about 0.8 volts). $\overline{D_{OUT0}}$ is equal to $V_{DD}-V_{BE}-I_{43}R_{21}$. If the logic states are changed so that $DIF_0$ is lower than $\overline{DIF_0}$, transistor 23 becomes nonconductive and transistor 24 becomes conductive so that the current is steered through transistor 24. $D_{OUT0}$ is then equal to $V_{DD}-V_{BE}-I_{43}R_{22}$, where $R_{22}$ represents the resistance through resistor 22, and $\overline{D_{OUT0}}$ is equal to $V_{DD}-V_{BE}$. N-channel transistor 43 provides a constant current source for transistors 23 and 24. N-channel transistors 39, 41, 45, and 47 provide constant current sources for the emitter-follower transistors 27, 25, 26, and 28, respectively.

Resistors 21 and 22 are used as the load for differential amplifier 11, instead of P-channel transistors, because they are less sensitive to the current source, power supply, temperature, and process variations. Also, resistors 21 and 22 can be made to track the current source provided by N-channel transistor 43, to provide a constant voltage drop across resistors 21 and 22. For example, if the resistance of resistors 21 and 22 increases because of increased temperature, the current through the resistors decreases, allowing the voltage drop to be relatively constant across resistors 21 and 22. Having a constant voltage drop across resistors 21 and 22 ensures that transistors 23 and 24 will not fall into saturation.

To deselect sense amplifier 20, select signal $SEL_0$ is a logic low, causing N-channel transistors 38, 40, 42, 44, and 46 to be nonconductive and P-channel transistors 31–37 to be conductive. $\overline{SEL_0}$ is a logic high, causing P-channel transistors 29 and 30 to be nonconductive. N-channel transistor 38 is nonconductive, preventing N-channel transistor 39 from providing a current source to the emitter of transistor 27. N-channel transistor 40 is nonconductive, preventing N-channel transistor 41 from providing a current source to the emitter of transistor 25. N-channel transistor 42 is nonconductive, preventing N-channel transistor 43 from providing a current source for the coupled emitters of transistors 23 and 24. N-channel transistor 44 is nonconductive, preventing N-channel transistor 45 from providing a current source to the emitter of transistor 26. N-channel transistor 46 is nonconductive, preventing N-channel transistor 47 from providing a current source to the emitter of transistor 28. Therefore, substantially no current is allowed to flow through sense amplifier 20.

When SEL is a logic low, sense amplifier 20 is deselected and P-channel transistor 34 is conductive, allowing the coupled emitters of transistors 23 and 24 at node N103 to be pulled to $V_{DD}-2V_{BE}$, thereby preventing the emitters of transistors 23 and 24 from floating, and avoiding a potential reverse bias problem. To prevent transistor 25 from being reverse-biased, both the base and the emitter of transistor 25 is coupled to $V_{DD}-2V_{BE}$ by P-channel transistors 31 and 33, respectively. To prevent transistor 26 from being reverse-biased, both the base and the emitter of transistor 26 is coupled to $V_{DD}-2V_{BE}$ by P-channel transistors 35 and 36, respectively.

P-channel transistors 29 and 30 are included in order to provide sense amplifier 20 with a wired-OR capability. If $\overline{SEL}$ is a logic high voltage, so that sense amplifier 20 is deselected, P-channel transistors 29 and 30 are nonconductive, causing the bases of transistors 27 and 28 to be isolated from the collectors of transistors 23 and 24. The bases of transistors 27 and 28 are then pulled to $V_{DD}-2V_{BE}$ through transistors 32 and 36, respectively, thus ensuring that transistors 27 and 28 are nonconductive. Transistors 27 and 28 cannot be biased into conduction until sense amplifier 20 is selected, thus providing sense amplifier 20 with a wired-OR capability.

The voltage required to protect transistors 27 and 28 from a large reverse bias is chosen to provide an adequate noise margin without subjecting transistors 27 and 28 to too much reverse bias, and to give sense amplifier 20 wired-OR capability. To ensure a large noise margin, it is best to pull the bases of transistors 27 and 28 close to $V_{SS}$, but that would cause transistors 27 and 28 to be reverse-biased beyond the acceptable reverse-bias limit established as $-2.5$ volts. To insure an adequate noise margin without too much reverse-bias, the base of transistors 27 and 28 are pulled to $V_{DD}-2V_{BE}$. $V_{DD}-2V_{BE}$ provides a noise margin of about one $V_{BE}$, while preventing transistors 27 and 28 from being reverse-biased below $-2.5$ volts.

A circuit to provide a voltage that is $2V_{BE}$ below the positive power supply voltage is not shown, but is well known in the art. A simple circuit to provide $V_{DD}-2V_{BE}$ can include two bipolar transistors or two diodes connected in series.

Figure 2:
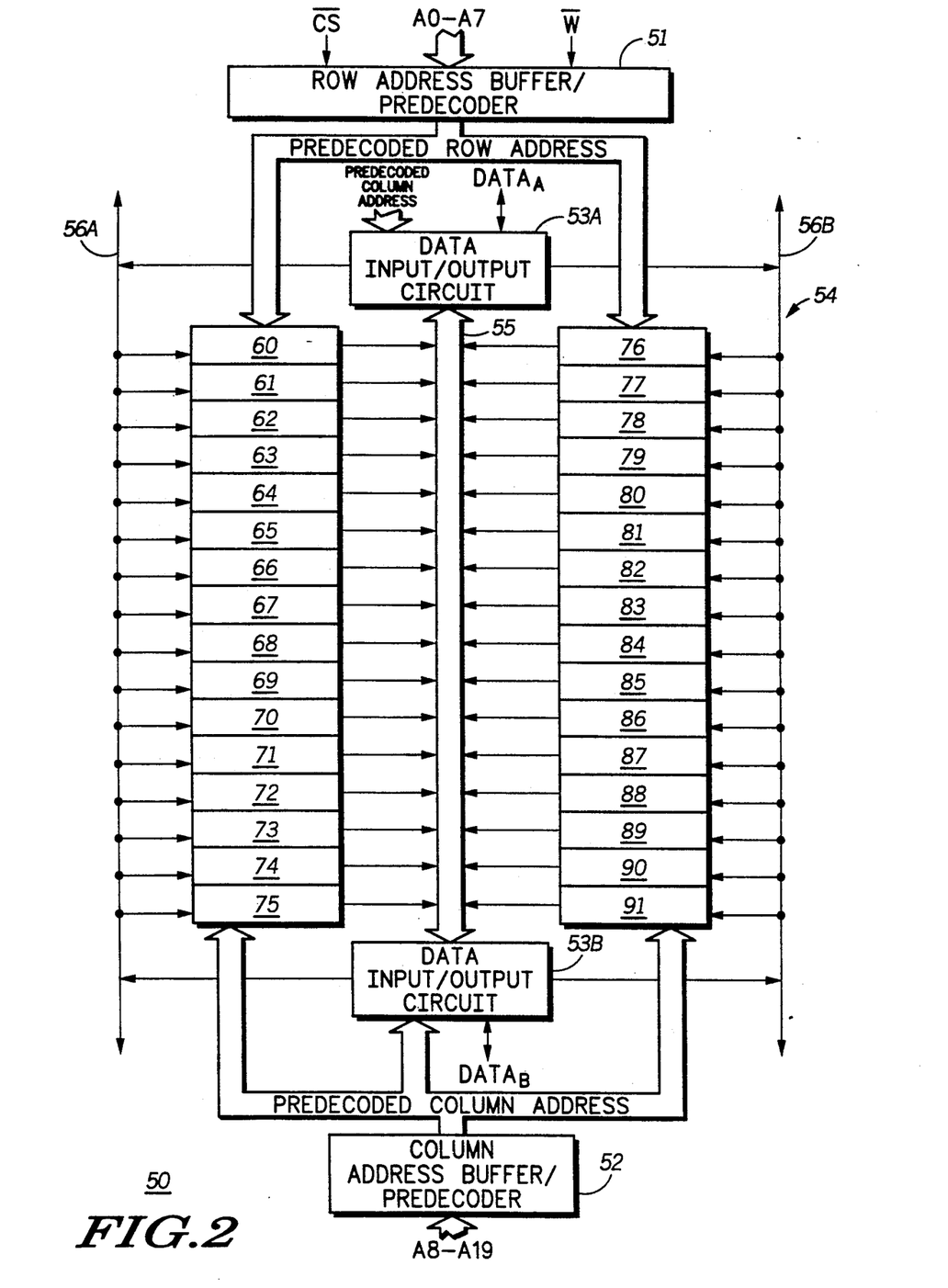
FIG. 2 illustrates in block diagram form a memory incorporating the present invention.

FIG. 2 illustrates in block form a memory 50 incorporating the present invention. Memory 50 includes a row address buffer/predecoder 51, a column address buffer/predecoder 52, data input/output circuits 53A and 53B, a plurality of memory blocks 54, a plurality of read global data lines 55, and a pluralities of write global data lines 56A and 56B. Plurality of memory blocks 54 includes thirty-two memory blocks 60–91 in the illustrated embodiment. Row address buffer/predecoder 51 receives a plurality of address signals including eight address signals labeled "A0–A7". In response, row address buffer/predecoder 51 provides a plurality of predecoded row address signals labeled "PREDECODED ROW ADDRESS" to each memory block. Likewise, column address buffer/predecoder 52 receives a plurality of address signals including twelve address signals labeled "A8-A19". In response, column address buffer/predecoder 52 provides a plurality of predecoded column address signals labeled "PREDECODED COLUMN ADDRESS". The particular address signals received by row address buffer/decoder 51 and column address buffer/decoder 52 have no special significance and may be different in other embodiments. Also, the amount of decoding performed by either row or column decoding may be varied in other embodiments. Features which are common to integrated circuit memories, such as pads for interconnection to the pins of the completed device, various timing and precharging circuits, and the like are not illustrated in FIG. 2 for purposes of brevity.

Each memory block receives PREDECODED ROW ADDRESS, PREDECODED COLUMN ADDRESS, and a plurality of differential signal pairs from corresponding write global data lines 56A or 56B, and provides a plurality of differential signal pairs to read global data lines 55. Read global data lines 55 conduct eight data signals represented as differential voltages between eight pairs of signal lines. Write global data lines 56A and 56B each conduct eight data signals represented as differential voltages between eight pairs of signal lines.

Memory 50 performs read cycles and write cycles. The read cycle is signified by control signal $\overline{CS}$ being asserted at a logic low, and control signal $\overline{W}$ being negated at a logic high. In response to signals $\overline{CS}$ and A0-A7, row address buffer/predecoder 51 provides 36 predecoded signals to select one of 512 rows in a selected memory block. Column address buffer/predecoder 52 provides thirteen predecoded column signals to each block. Within a selected block, the predecoded row address signals are further decoded to activate one of 512 word lines in a selected memory block. Column decoding selects eight memory cells within the selected memory block, and the contents of the eight selected memory cells are provided as differential signals between eight corresponding read global data line pairs in read global data lines 55. The sense amplifiers and control signals for the read cycle are not illustrated in FIG. 2 for the purpose of clarity, but are illustrated in FIG. 3. In other embodiments, a different number of memory cells may be selected. Data input/output circuit 53A then provides four signals designated as signal group $DATA_A$, while data input/output circuit 53B provides four signals designated as signal group $DATA_B$. Thus the data organization of memory 50 is X8.

Memory 50 conveniently supports other data organizations such as by-four (X4) and by-one (X1). Column address buffer/predecoder 52 receives additional address signals, and provides additional PREDECODED COLUMN ADDRESS signals to data input/output circuits 53A and 53B to further decode a portion of eight signals conducted on read global data lines 55. It should be apparent that if a X1 data organization is chosen, either data input/output circuit 53A or 53B would be unnecessary.

The write cycle is signified by both signals $\overline{CS}$ and $\overline{W}$ being active. In the write cycle, data input/output circuits 53A and 53B receive four bits each, designated respectively as signal groups $DATA_A$ and $DATA_B$. Each data signal $DATA_A$ and $DATA_B$ is then provided as a differential voltage between corresponding write global data line pairs to write global data lines 56A and 56B. Block selection, row, and column decoding proceed as in the read cycle to select one memory block and to provide predecoded signals to allow the selected memory block to couple the data to eight selected memory cells.

FIG. 3 illustrates in block diagram form a portion of memory 50 of FIG. 2, located between memory blocks 60 and 76, incorporating the present invention. Shown in FIG. 3 are eight read global data line pairs 55, labeled "GDL", sense amplifier stage 98, sense amplifier stage 99, and memory blocks 60 and 76. Sense amplifier stage 98 includes left pass circuit 100, left transfer circuit 101, right transfer circuit 102, right pass circuit 103, and sense amplifier 20. Sense amplifier stage 99 includes left pass circuit 106, left transfer circuit 107, right transfer circuit 109, right pass circuit 110, and sense amplifier 108. Read global data line pairs 55 comprises eight pairs of read global data line pairs to support word widths of X1, X4, or X8. Eight sense amplifier stages are shared between memory blocks 60 and 76. A representative SRAM memory cell 104 is illustrated in memory block 60 connected between a bit line pair labeled "$BL_7$" and "$\overline{BL_7}$", and connected to one a representative one of the 512 word lines labeled "WL". A representative SRAM memory cell 105 is illustrated in memory block 76 connected between a bit line pair labeled $BL_7$ and "$\overline{BL_7}$", and connected to one of the 512 word lines labeled "WL". There are 64 bit line pairs $BL_0/\overline{BL_0}$ to $BL_{63}/\overline{BL_{63}}$ in each memory block 60 and 76. To simplify FIG. 3, only two of the eight sense amplifier stages are depicted. All of the sense amplifiers represented in FIG. 3 have circuitry that is identical to that of sense amplifier 20 illustrated in FIG. 1.

Assume that data is to be read from memory cell 104 in memory block 60. During a read cycle of memory 50, left pass circuit 100 receives predecoded local column address labeled "$\overline{CPLOC_0}$-$\overline{CPLOC_7}$". A logic low on $\overline{CPLOC_7}$ will result in a corresponding differential signal pair labeled "$LDL_0/\overline{LDL_0}$" being provided to left transfer circuit 101 labeled "$LTFER_0$". Left transfer circuit 101 receives block select signal labeled "$BS_{60}$" and select signals labeled "$SEL_0/\overline{SEL_0}$". A logic high on both $BS_{60}$ and $SEL_0$ will cause a differential signal pair labeled "$DIF_0/\overline{DIF_0}$", corresponding to $LDL_0/\overline{LDL_0}$, to be provided to sense amplifier 20, labeled "$AMP_0$". $SEL_0$ is also provided to sense amplifier 20, causing sense amplifier 20 to be selected (or turned on). Sense amplifier 20 then senses the small voltage difference between differential signals $DIF_0/\overline{DIF_0}$, amplifies them, and provides a corresponding differential signal pair labeled "$D_{OUT}/\overline{D_{OUT0}}$" to one pair of the eight global data line pairs 55.

To prevent conflicts between the sense amplifiers, only one sense amplifier can provide data to a single pair of the eight global data line pairs 55 at a time. Sense amplifiers from other memory blocks not shown in FIG. 3 are wired-OR connected read global data line pairs 55. All of the other sense amplifiers that are wired-OR connected to the same global data line pair 55 as sense amplifier 20 are deselected, as illustrated in FIG. 1. Each of the 8 sense amplifiers located between memory blocks 60 and 76 are coupled to a different pair of the eight pairs of read global data lines 55. A block select signal labeled "$BS_{76}$" prevents right transfer circuit 102 from providing a signal pair to sense amplifier 20 at the same time that left transfer circuit 101 is providing data to sense amplifier 20. Sense amplifier 20 is prevented from receiving data from both memory block 60 and and memory block 76 at the same time.

While the invention has been described in the context of a preferred embodiment, it will be apparent to those skilled in the art that the present invention may be modified in numerous ways and may assume many embodiments other than that specifically set out and described above. For example, other types of reference and bias voltage circuits may be substituted for those illustrated. A $P_{BIAS}$ generator may be used instead of an $N_{BIAS}$ generator if a particular application called for $P_{BIAS}$ instead of $N_{BIAS}$. Accordingly, it is intended by the appended claims to cover all modifications of the invention which fall within the true spirit and scope of the invention.

We claim:

1. A memory having a sense amplifier for detecting and amplifying signals read from a memory cell, the sense amplifier comprising:

a first input stage including a first emitter-follower bipolar transistor having a base for receiving a first input signal, and an emitter for providing a first internal signal, and a first current source having a first terminal coupled to a negative power supply voltage terminal and a second terminal coupled to said emitter of said first bipolar transistor;

a second input stage including a second emitter-follower bipolar transistor having a base for receiving a second input signal, and an emitter for providing a second internal signal, and a second current source having a first terminal coupled to said negative power supply voltage terminal and a second terminal coupled to said emitter of said second bipolar transistor;

a differential amplifier stage including third and fourth bipolar transistors having bases for respectively receiving said first internal signal and said second internal signal and having emitters coupled together, collectors of said third and fourth transistors respectively providing third and fourth internal signals and a third current source having a first terminal coupled to said negative power supply voltage terminal and a second terminal coupled to said coupled emitters of said third and fourth bipolar transistors;

a first output stage including a fifth bipolar transistor having a base coupled to said collector of said third bipolar transistor for receiving said third internal signal and an emitter for providing a first output signal, and a fourth current source having a first terminal coupled to said negative power supply voltage terminal and a second terminal coupled to said emitter of said fifth bipolar transistor;

a second output stage including a sixth bipolar transistor having a base coupled to said collector of said fourth bipolar transistor for receiving said fourth internal signal and an emitter for providing a second output signal and a fifth current source having a first terminal coupled to said negative power supply voltage terminal and a second terminal coupled to said emitter of said sixth bipolar transistor;

coupling means for coupling said base of said fifth bipolar transistor to said collector of said third bipolar transistor and for coupling said base of said sixth bipolar transistor to said collector of said fourth bipolar transistor in response to a first control signal; and reverse-bias protection means for providing a predetermined voltage to the each of the bases of said first, second, third, fourth, fifth, and sixth bipolar transistors and to said coupled emitters of said third and fourth bipolar transistors, and for decoupling said first, second, third, fourth, and fifth current sources from said emitters of said first, second, third, fourth, fifth, and sixth bipolar transistors in response to a second control signal.

2. The memory of claim 1, wherein said second input signal is a logical complement of said first input signal.

3. The memory of claim 1, wherein said coupling means comprises:

a first P-channel transistor having a first drain/source terminal connected to said base of said fifth bipolar transistor, a second drain/source terminal connected to said collector of said third bipolar transistor, and a gate for receiving said first control signal; and a second P-channel transistor having a first drain/source terminal connected to said base of said sixth bipolar transistor, a second drain/source terminal connected to said collector said fourth bipolar transistor, and a gate for receiving said first control signal.

4. The memory of claim 3, wherein said reverse-bias protection means comprises:

a third P-channel transistor having a source for receiving said predetermined voltage, a drain coupled between said coupled emitters of said differential amplifier stage, and a gate for receiving said second control signal;

a fourth P-channel transistor having a source for receiving said predetermined voltage, a drain coupled to said emitter of said first emitter-follower bipolar transistor, and a gate for receiving said second control signal;

a fifth P-channel transistor having a source for receiving said predetermined voltage, a drain coupled to said emitter of said second emitter-follower bipolar transistor, and a gate for receiving said second control signal;

a sixth P-channel transistor having a source for receiving said predetermined voltage, a drain coupled to said base of said fifth bipolar transistor, and a gate for receiving said second control signal;

a seventh P-channel transistor having a source for receiving said predetermined voltage, a drain coupled to said base of said sixth bipolar transistor, and a gate for receiving said second control signal;

a first N-channel transistor having a drain coupled to said coupled emitters of said differential amplifier stage, a source coupled to said second terminal of said first current source, and a gate for receiving said second control signal;

a second N-channel transistor having a drain coupled to said emitter of said third bipolar transistor, a source coupled to said second terminal of said second current source, and a gate for receiving said second control signal;

a third N-channel transistor having a drain coupled to said emitter of said fourth bipolar transistor, a source coupled to said second terminal of said third current source, and a gate for receiving said second control signal;

a fourth N-channel transistor having a drain coupled to said emitter of said fifth bipolar transistor, a source coupled to said second terminal of said fourth current source, and a gate for receiving said second control signal; and a fifth N-channel transistor having a drain coupled to said emitter of said sixth bipolar transistor, a source coupled to said second terminal of said fourth current source, and a gate for receiving said second control signal.

5. The memory of claim 4, wherein said second control signal is a complement of said first control signal.

6. The memory of claim 1, wherein said predetermined voltage is equal to a positive power supply voltage minus two base-emitter diode voltage drops.

7. The memory of claim 1, wherein said first, second, third, fourth, and fifth current sources are each comprised of an N-channel transistor.

8. A memory having a sense amplifier for detecting and amplifying signals read from a memory cell, the sense amplifier comprising:

a first resistor having a first terminal connected to a first positive power supply voltage terminal and a second terminal;

a second resistor having a first terminal connected to said first positive power supply voltage terminal and a second terminal;

a first bipolar transistor having a collector connected to said second terminal of said first resistor, a base for receiving a first input signal, and an emitter;

a second bipolar transistor having a collector connected to said second terminal of said second resistor, a base for receiving a second input signal, and an emitter connected to said emitter of said first bipolar transistor;

a third bipolar transistor having a collector connected to said first positive power supply voltage terminal, a base, and an emitter for providing a first output signal;

a first MOSFET transistor having a first drain/source terminal connected to said base of said third bipolar transistor, a second drain/source terminal connected to said collector of said first bipolar transistor, and a gate for receiving a first select signal;

a fourth bipolar transistor having a collector connected to said first positive power supply voltage terminal, a base, and an emitter for providing a second output signal;

a second MOSFET transistor having a first drain/source terminal connected to said base of said fourth bipolar transistor, a second drain/source terminal connected to said collector of said second bipolar transistor, and a gate for receiving said first select signal;

a third MOSFET transistor having a source connected to a second positive power supply voltage terminal, a gate for receiving a second select signal, and a drain connected to said base of said third bipolar transistor;

a fourth MOSFET transistor having a source connected to said second positive power supply voltage terminal, a gate for receiving said second select signal, and a drain connected to said base of said first bipolar transistor;

a fifth MOSFET transistor having a source connected to said second positive power supply voltage terminal, a gate for receiving said second select signal, and a drain connected to said emitters of said first and second bipolar transistors;

a sixth MOSFET transistor having a source connected to said second positive power supply voltage terminal, a gate for receiving said second select signal, and a drain connected to said base of said second bipolar transistor;

a seventh MOSFET transistor having a source connected to said second positive power supply voltage terminal, a gate for receiving said second select signal, and a drain connected to said base of said fourth bipolar transistor;

an eighth MOSFET transistor having a drain connected to said emitters of said first and second bipolar transistors, a gate for receiving said second select signal, and a source;

a ninth MOSFET transistor having a drain connected to said source of said eighth MOSFET transistor, a gate for receiving a bias voltage, and a source connected to a negative power supply voltage terminal;

a tenth MOSFET transistor having a drain connected to said base of said first bipolar transistor, a gate for receiving said second select signal, and a source;

an eleventh MOSFET transistor having a drain connected to said source of said tenth MOSFET transistor, a gate for receiving said bias voltage, and a source connected to said negative power supply voltage terminal;

a twelfth MOSFET transistor having a drain connected to said base of said second bipolar transistor, a gate for receiving said second select signal, and a source; and a thirteenth MOSFET transistor having a drain connected to said source of said twelfth MOSFET transistor, a gate for receiving said bias voltage, and a source connected to said negative power supply voltage terminal.

9. The sense amplifier of claim 8, wherein said first, second, third, and fourth bipolar transistors are NPN transistors.

10. The sense amplifier of claim 8, wherein said second positive power supply voltage is substantially equal to said first positive power supply voltage minus two base-emitter voltage drops.

11. The sense amplifier of claim 8, wherein said second input signal is a complement of said first input signal, and said second output signal is a complement of said first output signal.

12. The sense amplifier of claim 8, wherein said eighth, ninth, tenth, eleventh, twelfth, and thirteenth MOSFET transistors are N-channel MOSFET transistors and said first, second, third, fourth, fifth, sixth, and seventh MOSFET transistors are P-channel MOSFET transistors.

13. The sense amplifier of claim 8 wherein said second select signal is a complement of said first select signal.

14. A memory having a write mode, for writing data into a selected memory cell via a selected bit line pair, and a read mode, for reading data provided onto a selected bit line pair, comprising:

a plurality of memory cells coupled to word lines and bit line pairs, each memory cell for receiving data from the bit line pair to which it is coupled, when the word line to which it is coupled is selected;

a row decoder, coupled to the word lines, for enabling a selected word lines as determined by a row address;

a column decoder for coupling a selected bit line pair to a data line pair as determined by a column address; and a sense amplifier for sensing and amplifying data on the data line pair when said memory is in said read mode, comprising:

a differential amplifier comprising first and second bipolar transistors and a current source, and having an input terminal for receiving an input signal, and an output terminal;

a third bipolar transistor having a collector coupled to a first power supply voltage terminal, an emitter for providing an output signal, and a base;

coupling means for coupling said output terminal of said differential amplifier to said base of said first transistor in response to a control signal being in a first logic state; and reverse-bias protection means for biasing the base and the emitter of each of said first, second, and third bipolar transistors to a predetermined voltage and decoupling said current source from said first and second bipolar transistors in response to said control signal being in a second logic state, said reverse-bias protection means for preventing said first, second, and third bipolar transistors from being excessively reverse-biased.

15. The memory of claim 14, wherein said output signal switches between a first voltage and a second voltage when said control signal is in said first logic, said second voltage being less than said first voltage, and said predetermined voltage being no more than one diode voltage drop less than said second voltage.

16. The memory of claim 14, wherein said coupling means comprises a first P-channel transistor having a first drain/source terminal coupled to said base of said transistor, a second drain/source terminal coupled to said output terminal, and a gate for receiving said control signal.

17. The memory of claim 14, wherein said reverse-bias protection means comprises a second P-channel transistor having a source for receiving said predetermined voltage, a drain coupled to said base of said first transistor, and a gate for receiving said control signal.

18. A sense amplifier for an integrated circuit memory, comprising:

a differential amplifier including first and second bipolar transistors having bases for receiving first and second input signals, respectively, an emitter of said first bipolar transistor coupled to an emitter of said second bipolar transistor, collectors of said first and second transistors respectively providing first and second internal signals, and a first current source coupled to said emitters of said first and second bipolar transistors;

an emitter-follower transistor having a base for receiving said first internal signal, and an emitter for providing an output signal;

a second current source coupled to said emitter of said emitter-follower transistor;

coupling means for coupling said base of said emitter-follower transistor to said collector of said first bipolar transistor in response to a select signal being in a first logic state, and decoupling said base of said emitter-follower transistor from said collector of said first bipolar transistor in response to said select signal being in a second logic state; and reverse-bias protection means for providing a predetermined voltage to said bases and said emitters of said first and second bipolar transistors, and to said base and said emitter of said emitter-follower transistor in response to said select signal being in said second logic state, said reverse-bias protection means decoupling said first current source from said coupled emitters, and said second current source from said emitter-follower transistor in response to said select signal being in said second logic state, said reverse-bias protection means preventing said first, second bipolar transistors, and emitter-follower transistors from being excessively reverse-biased when said select signal is in said second logic state.

19. The memory of claim 18, wherein said coupling means comprises a first P-channel transistor having a first drain/source terminal connected to the base of said emitter-follower transistor, a second drain/source terminal connected to the collector of said first bipolar transistor, and a gate for receiving said select signal.

20. The memory of claim 18, wherein said predetermined voltage is substantially equal to said a power supply voltage minus two base-emitter diode voltage drops.

21. The memory of claim 18, wherein said first and second current sources each comprises an N-channel transistor.

22. The memory of claim 18, wherein said reverse-bias protection means comprises:

a first P-channel transistor having a source for receiving said predetermined voltage, a drain coupled between said coupled emitters of said differential amplifier, and a gate for receiving said select signal;

a second P-channel transistor having a source for receiving said predetermined voltage, a drain coupled to said base of said emitter-follower transistor, and a gate for receiving said select signal;

a third P-channel transistor having a source for receiving said predetermined voltage, a drain coupled to said base of said first bipolar transistor, and a gate for receiving said select signal; and a fourth P-channel transistor having a source for receiving said predetermined voltage, a drain coupled to said base of said second bipolar transistor, and a gate for receiving said select signal.

* * * * *

UNITED STATES PATENT AND TRADEMARK OFFICE
CERTIFICATE OF CORRECTION

PATENT NO. : 5,287,314
DATED : Feb. 15, 1994
INVENTOR(S) : Stephen T. Flannagan; Taisheng Feng It is certified that error appears in the above-indentified patent and that said Letters Patent is hereby corrected as shown below:

In claim 16, column 13, line 41,

Before "transistor", add --third--.

Signed and Sealed this

Ninth Day of August, 1994

Attest:

BRUCE LEHMAN

Attesting Officer

Commissioner of Patents and Trademarks